(12) United States Patent
Bedell et al.

(10) Patent No.: US 10,424,644 B2
(45) Date of Patent: Sep. 24, 2019

(54) METHOD OF MAKING A GALLIUM NITRIDE DEVICE

(71) Applicant: International Business Machines Corporation, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/630,102

(22) Filed: Jun. 22, 2017

(65) Prior Publication Data

US 2017/0294517 A1    Oct. 12, 2017

Related U.S. Application Data

(62) Division of application No. 14/986,519, filed on Dec. 31, 2015, now Pat. No. 9,748,353.

(51) Int. Cl.
*H01L 21/02* (2006.01)
*H01L 21/28* (2006.01)
(Continued)

(52) U.S. Cl.
CPC .... *H01L 29/2003* (2013.01); *H01L 21/02172* (2013.01); *H01L 21/6835* (2013.01);
(Continued)

(58) Field of Classification Search
CPC ............. H01L 31/022433; H01L 31/0465
See application file for complete search history.

(56) References Cited

U.S. PATENT DOCUMENTS 9,666,677 B1 *  5/2017  Raring ............... H01L 29/205
2014/0017846 A1 *  1/2014  Moslehi ........... H01L 31/02363
                                                                438/71
(Continued)

OTHER PUBLICATIONS

List of IBM Patents or Patent Applications Treated as Related; (Appendix P), Filed Jun. 22, 2017; 2 pages.

(Continued)

*Primary Examiner* — Farun Lu
(74) *Attorney, Agent, or Firm* — Cantor Colburn LLP; L. Jeffrey Kelly

(57) ABSTRACT

A method of making a GaN device includes: forming a GaN substrate; forming a plurality of spaced-apart first metal contacts directly on the GaN substrate; forming a layer of insulating GaN on the exposed portions of the upper surface; forming a stressor layer on the contacts and the layer of insulating GaN; forming a handle substrate on the first surface of the stressor layer; spalling the GaN substrate that is located beneath the stressor layer to separate a layer of GaN and removing the handle substrate; bonding the stressor layer to a thermally conductive substrate; forming a plurality of vertical channels through the GaN to define a plurality of device structures; removing the exposed portions of the layer of insulating GaN to electrically isolate the device structures; forming an ohmic contact layer on the second surface; and forming second metal contacts on the ohmic contact layer.

11 Claims, 7 Drawing Sheets

(51) Int. Cl.
*H01L 29/20* (2006.01)
*H01L 29/45* (2006.01)
*H01L 33/00* (2010.01)
*H01L 33/06* (2010.01)
*H01L 33/32* (2010.01)
*H01L 33/40* (2010.01)
*H01L 21/683* (2006.01)
*H01L 21/768* (2006.01)
*H01L 23/528* (2006.01)
*H01L 23/532* (2006.01)
*H01L 31/0224* (2006.01)
*H01L 31/0465* (2014.01)

(52) U.S. Cl.
CPC ........ *H01L 21/7685* (2013.01); *H01L 23/528* (2013.01); *H01L 23/53209* (2013.01); *H01L 23/53257* (2013.01); *H01L 23/53261* (2013.01); *H01L 29/452* (2013.01); *H01L 31/022433* (2013.01); *H01L 31/0465* (2014.12); *H01L 33/0075* (2013.01); *H01L 33/0079* (2013.01); *H01L 33/06* (2013.01); *H01L 33/32* (2013.01); *H01L 33/40* (2013.01); *H01L 21/28* (2013.01); *H01L 2221/68381* (2013.01); *H01L 2933/0016* (2013.01)

(56) References Cited

U.S. PATENT DOCUMENTS

2014/0170803 A1* 6/2014 Sapirman ................ H01L 31/18
                                                    438/87
2018/0190919 A1* 7/2018 Schmidt ........... H01L 31/02242

OTHER PUBLICATIONS

Stephen W. Bedell et al."Method of Making a Gallium Nitride Device", U.S. Appl. No. 14/986,519, filed Dec. 31, 2015.

* cited by examiner

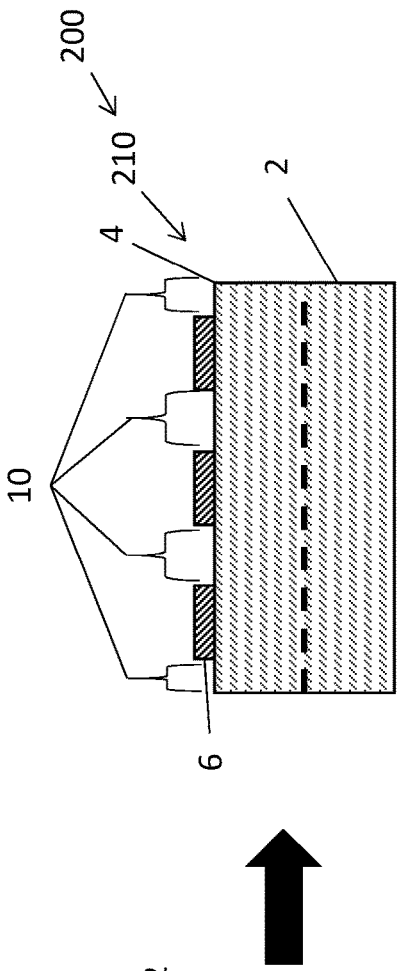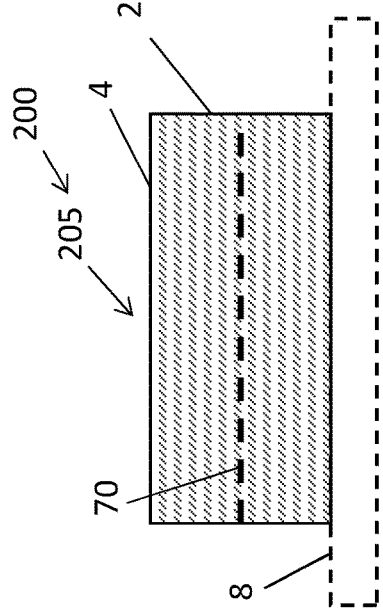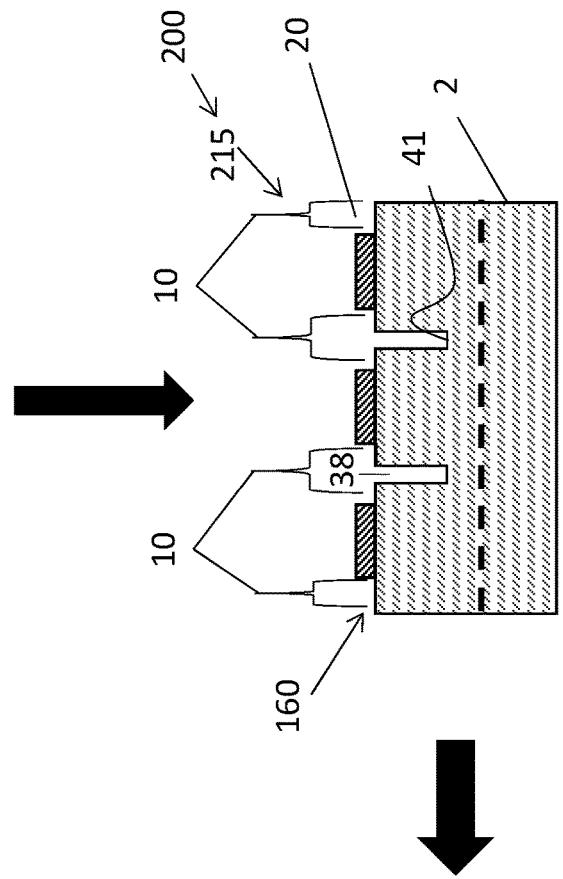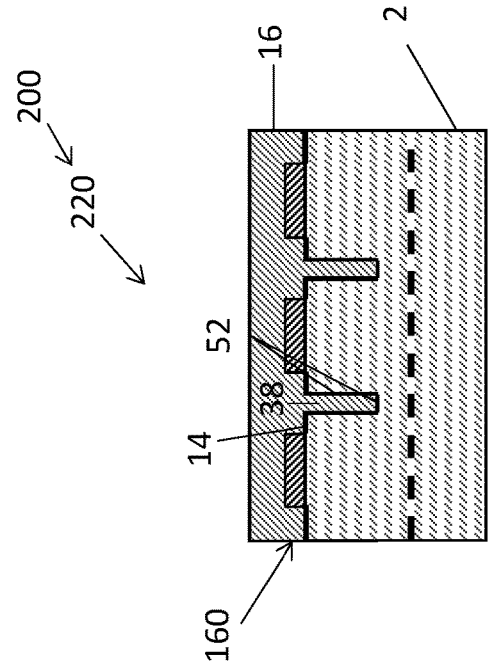

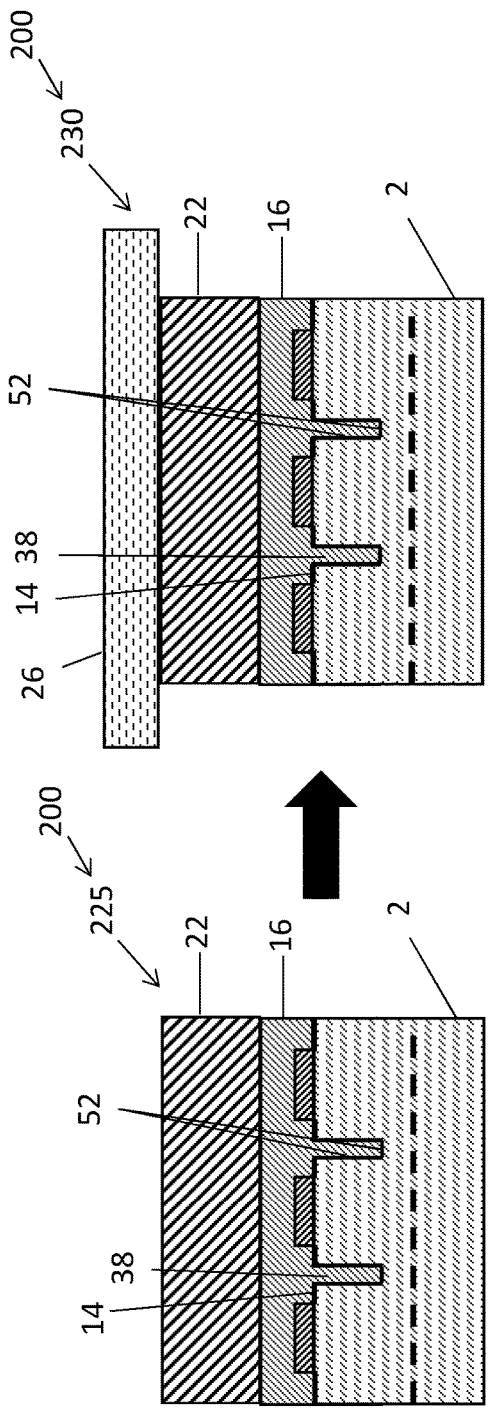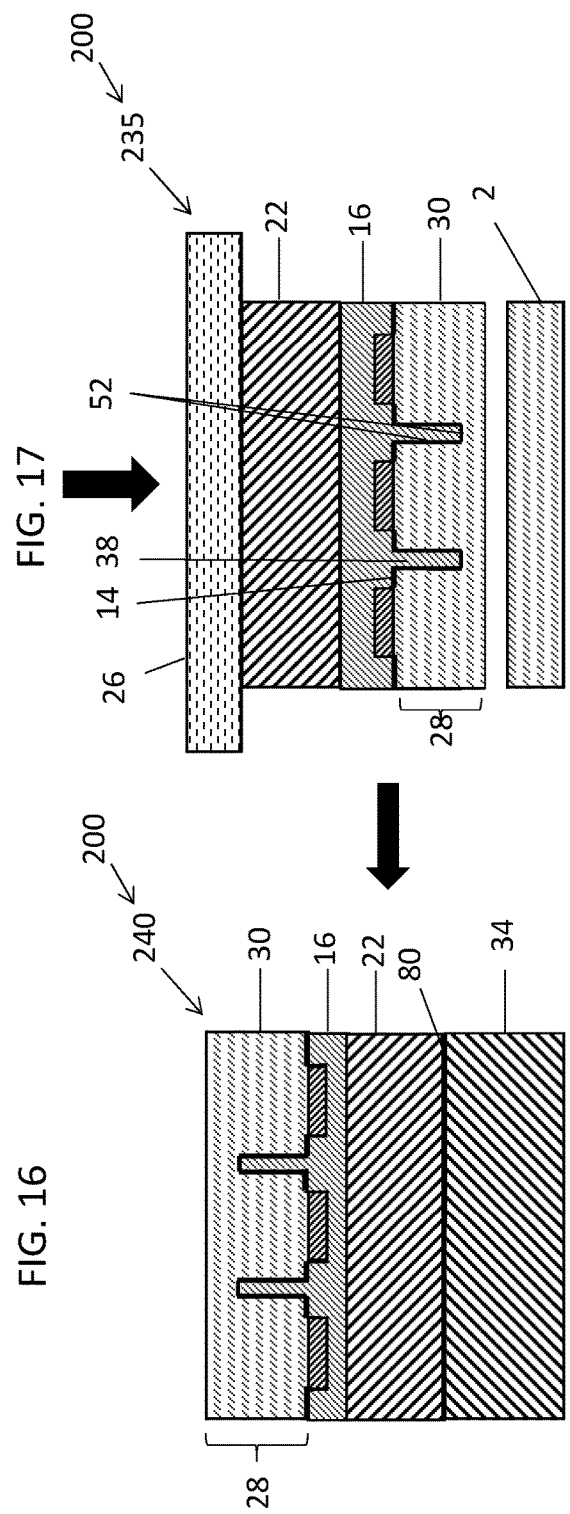
FIG. 16
FIG. 17
FIG. 18
FIG. 19

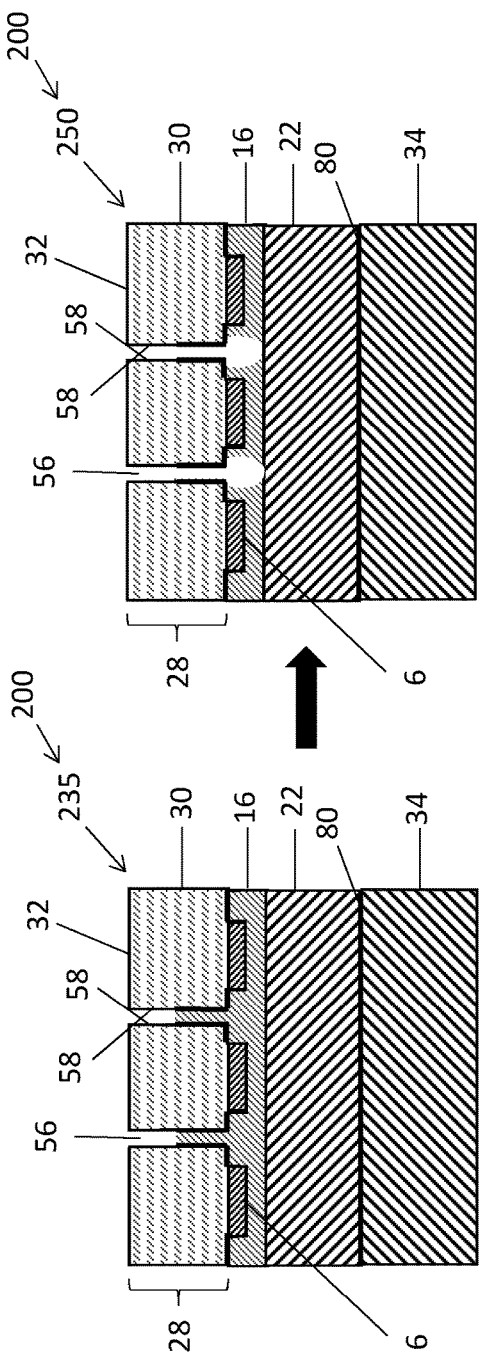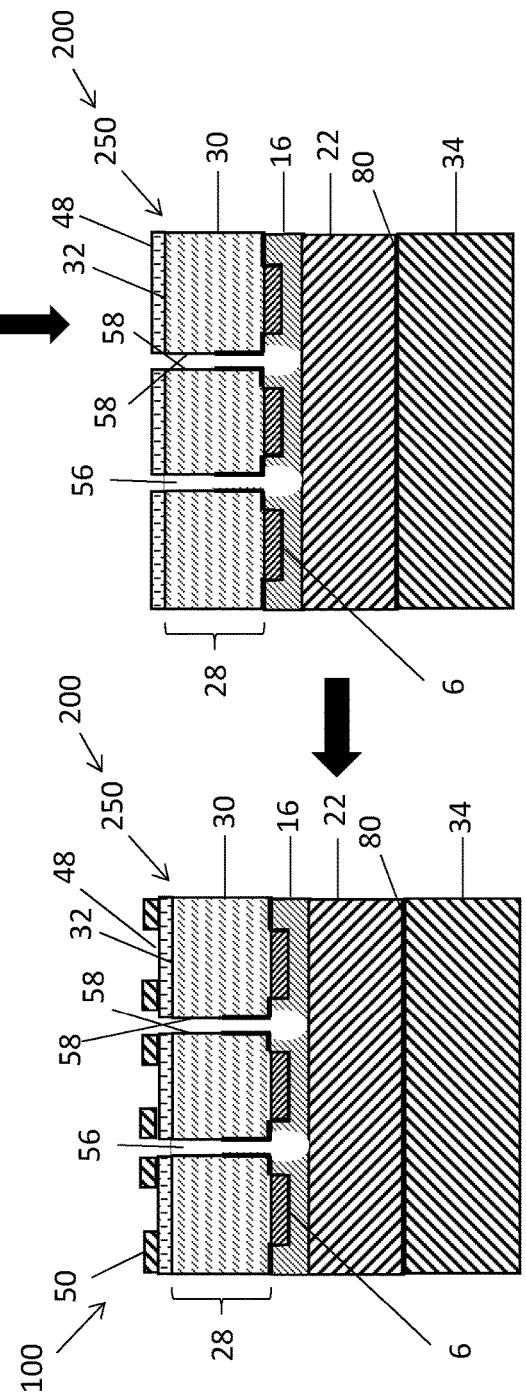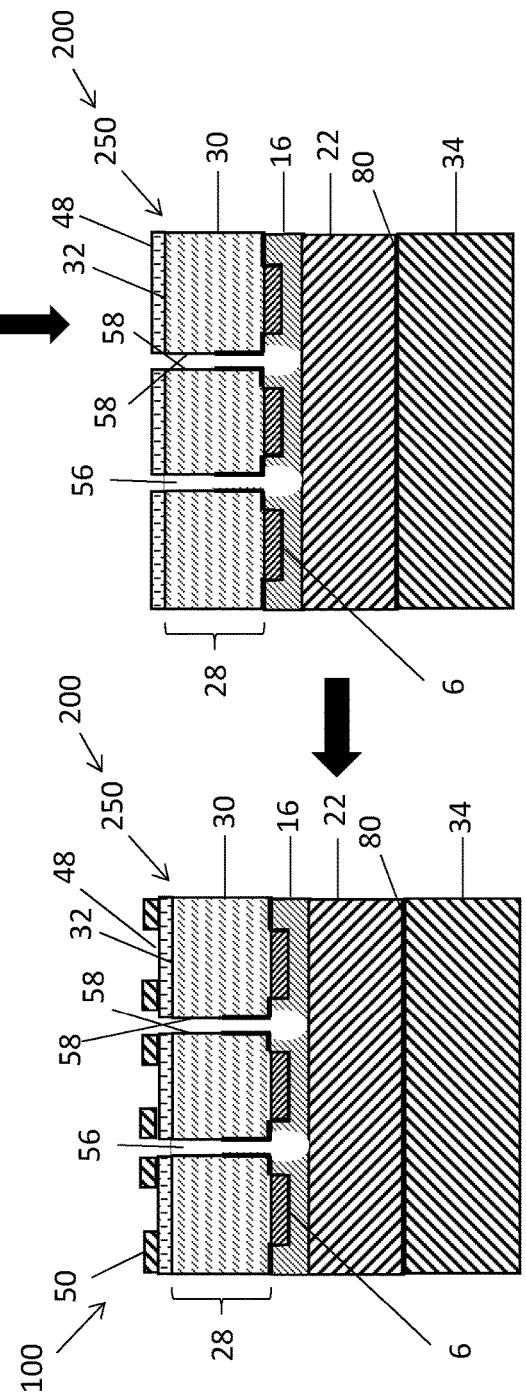

METHOD OF MAKING A GALLIUM NITRIDE DEVICE

DOMESTIC PRIORITY

This application is a divisional of U.S. application Ser. No. 14/986,519, titled "METHOD OF MAKING A GALLIUM NITRIDE DEVICE" filed Dec. 31, 2015, the contents of which are incorporated by reference herein in its entirety.

BACKGROUND

The present invention generally relates to semiconductor device manufacturing and semiconductor devices, and more particularly to a method of making gallium nitride (GaN) devices by spalling and the GaN devices made thereby.

Surface layer removal from brittle substrates using controlled spalling technology is a powerful method for changing the cost structure of high-efficiency photovoltaic materials, as well as enabling new features in a range of semiconductor technologies (e.g., flexible photovoltaics, flex circuits and displays). This technology uses application of a tensile stressor layer on the surface of a base substrate to be spalled. The tensile stressor layer has a combined thickness and stress that is sufficient to induce spalling mode fracture in the base substrate.

Handling layers that are applied to the surface of the stressor/substrate combination are then used to control the initiation and fracture propagation (spalling) leading to the removal of continuous surface layers from the base substrate.

Spalling offers a low cost, simple approach for removing many thin semiconductor layers from a comparatively expensive thick base substrate of many different semiconductor materials. The thin layers of semiconductor material can then be used for semiconductor device manufacture. This method enables the low cost manufacture of novel thin layers of semiconductor materials that have not previously been available for device manufacture in this form. These newly available thin layers of semiconductor materials require new processes for the manufacture of semiconductor devices from them.

The method described herein advantageously provides a method for the manufacture of GaN devices from a thin layer of spalled GaN, particularly novel GaN devices comprising an insulating GaN layer formed from the spalled GaN. The method also includes a method a forming the GaN insulating layer.

SUMMARY

According to an embodiment of the present invention, a method of making a GaN device is disclosed. The method includes: forming a GaN substrate having an upper surface; forming a plurality of spaced-apart first metal contacts directly on the upper surface of the GaN substrate, the contacts spaced apart by exposed portions of the upper surface; forming a layer of insulating GaN on the exposed portions of the upper surface; forming a stressor layer on the contacts and the layer of insulating GaN, the stressor layer having a first surface; forming a handle substrate on the first surface of the stressor layer; spalling the GaN substrate that is located beneath the stressor layer to separate a layer of GaN and expose a stressor layer second surface and removing the handle substrate; bonding the first surface of the stressor layer to a thermally conductive substrate; forming a plurality of vertical channels having opposing sidewalls through the insulating GaN to provide exposed portions of the layer of insulating GaN to define a plurality of device structures, each device structure comprising at least one contact; removing the exposed portions of the layer of insulating GaN to electrically isolate the device structures; and forming an ohmic contact layer on the stressor layer second surface; and forming a plurality of second metal contacts on the ohmic contact layer.

According to another embodiment of the present invention, a second method of making a GaN device is disclosed. The method includes: forming a GaN substrate having an upper surface; forming a plurality of spaced-apart first metal contacts directly on the upper surface of the GaN substrate, the contacts spaced apart by exposed portions of the upper surface; forming a plurality of first vertical channels having first opposing sidewalls in the exposed portions of the upper surface partially through the insulating GaN to define a plurality of device structures, each device structure configured to comprise at least one contact; forming a metal layer on the contacts, the exposed portions of the upper surface and the first opposing sidewalls, the forming of the metal layer forming a layer of insulating GaN on the exposed portions of the upper surface and the first opposing sidewalls; forming a stressor layer on the metal layer, the stressor layer having a first surface; forming a handle substrate on the first surface of the stressor layer; spalling the GaN substrate that is located beneath the stressor layer to separate a layer of GaN and expose a stressor layer second surface and removing the handle substrate; bonding the first surface of the stressor layer to a thermally conductive substrate; defining a plurality of second vertical channels having second opposing sidewalls and corresponding to the first vertical channels through the insulating GaN to exposed portions of the metal layer in the first channels; removing the metal layer in and under the first channels to the stressor layer to electrically isolate the device structures; forming an ohmic contact layer on the stressor layer second surface; and forming a plurality of second metal contacts on the ohmic contact layer.

According to yet another embodiment of the present invention, a semiconductor device includes a substrate, a first insulating layer arranged on the substrate, a conductive metal layer arranged on the first insulating layer, a contact arranged on the conductive metal layer, a semiconductor layer arranged on the contact, and an oxide region arranged adjacent to the contact in the conductive metal layer.

BRIEF DESCRIPTION OF THE DRAWINGS

FIG. 12 is a cross-sectional illustration of an embodiment of forming a GaN substrate according to a second embodiment of a method of making a GaN device;

FIG. 13 is a cross-sectional illustration of an embodiment of forming a plurality of spaced-apart first metal contacts according to a second embodiment of a method of making a GaN device;

FIG. 14 is a cross-sectional illustration of an embodiment of forming a plurality of channels in the insulating GaN layer according to a second embodiment of a method of making a GaN device;

FIG. 15 is a cross-sectional illustration of an embodiment of forming a metal layer on the contacts, the exposed portions of the upper surface and the first opposing sidewalls, the forming of the metal layer forming a layer of insulating GaN on the exposed portions of the upper surface and the first opposing sidewalls according to a second embodiment of a method of making a GaN device;

FIG. 16 is a cross-sectional illustration of an embodiment of forming a stressor layer according to a second embodiment of a method of making a GaN device;

FIG. 17 is a cross-sectional illustration of an embodiment of forming a handle substrate according to a second embodiment of a method of making a GaN device;

FIG. 18 is a cross-sectional illustration of an embodiment of spalling the GaN substrate according to a second embodiment of a method of making a GaN device;

FIG. 19 is a cross-sectional illustration of an embodiment of bonding the first surface of the stressor layer to a thermally conductive substrate according to a second embodiment of a method of making a GaN device;

FIG. 20 is a cross-sectional illustration of an embodiment of defining a plurality of second vertical channels having second opposing sidewalls and corresponding to the first vertical channels through the insulating GaN layer to exposed portions of the metal layer in the first channels according to a second embodiment of a method of making a GaN device;

FIG. 21 is a cross-sectional illustration of an embodiment of removing the metal layer in and under the first channels to the stressor layer to electrically isolate the device structures according to a first embodiment of a method of making a GaN device;

FIG. 22 is a cross-sectional illustration of an embodiment of forming an ohmic contact layer on the stressor layer second surface according to a second embodiment of a method of making a GaN device;

FIG. 23 is a cross-sectional illustration of an embodiment of forming a plurality of second metal contacts on the ohmic contact layer according to a second embodiment of a method of making a GaN device and a second embodiment of the structure of a GaN device made thereby.

DETAILED DESCRIPTION

Figure 1:
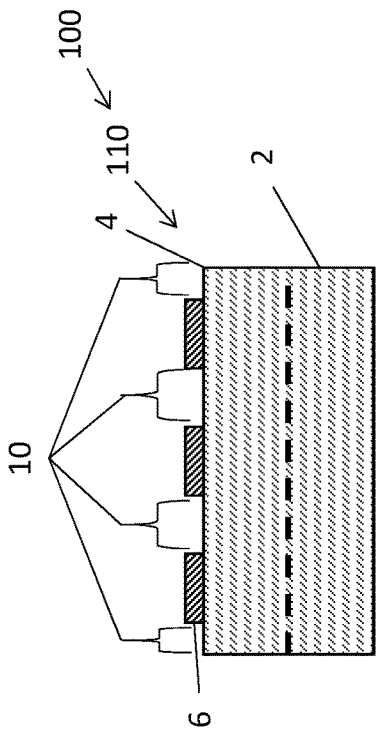
FIG. 1 is a cross-sectional illustration of an embodiment of forming a GaN substrate according to a first embodiment of a method of making a GaN device.

To achieve these and other advantages, and in accordance with the purpose of this invention as embodied and broadly described herein, the following detailed embodiments can be embodied in various forms.

The specific processes, materials compounds, compositions, and structural details set out herein not only comprise a basis for the claims and a basis for teaching one skilled in the art to employ the present invention in any novel and useful way, but also provide a description of how to make and use this invention.

In the following description, numerous specific details are set forth, such as particular structures, components, materials, dimensions, processing steps and techniques, in order to illustrate the present disclosure. However, it will be appreciated by one of ordinary skill in the art that various embodiments of the present disclosure may be practiced without these, or with other, specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring to the figures, particularly FIGS. 1-25, embodiments of a method 100, 200 of making gallium nitride (GaN) devices are disclosed. The methods 100, 200 may be advantageously used to make various GaN semiconductor devices, including various diode and transistor devices, including various light emitting diodes (LED's). GaN is a binary III/V direct bandgap semiconductor suitable for use to make bright light-emitting diodes. GaN is a very hard material that generally has a Wurtzite crystal structure, and alternately can be formed with a cubic structure. It has a wide band gap of about 3.4 eV which affords applications in optoelectronic devices, including high-power and high-frequency devices. For example, GaN may be used to make violet (405 nm) laser diodes, without the use of nonlinear optical frequencydoubling. The GaN devices afforded by the method 100, 200 have low sensitivity to ionizing radiation, making it a suitable material for solar cell arrays for satellites. GaN transistors can operate at much higher temperatures and work at much higher voltages than gallium arsenide (GaAs) transistors, for example, and are useful for power amplifiers at microwave frequencies. GaN can be doped with silicon (Si) or with oxygen to n-type and with magnesium (Mg) to p-type. Gallium nitride compounds also tend to have a microstructure that includes a high dislocation density, on the order of a hundred million to ten billion defects per square centimeter, and without being limited by theory the GaN microstructure is believed to be sensitive to various semiconductor processing-induced defects when exposed to various semiconductor processes, particularly those utilizing plasma discharge, such as, for example, various sputtering, reactive ion etching, ion milling processes. The very high breakdown voltages, high electron mobility and saturation velocity of GaN has also made it an ideal candidate for high-power and high-temperature microwave applications, as evidenced by its high Johnson's figure of merit. Additional potential applications for high-power/high-frequency devices based on GaN include microwave radio-frequency power amplifiers (such as those used in high-speed wireless data transmission) and high-voltage switching devices for power grids, and as RF transistors, such as the microwave source for microwave ovens, and in various FET structures. The large band gap means that the performance of GaN transistors is maintained up to higher temperatures than silicon transistors. The methods 100, 200 may be performed in any suitable sequence of the elements/operations disclosed herein, including the specific sequences of the elements and operations described herein.

Referring to FIGS. 1-11, a method 100 of making a GaN device 10 is disclosed. The method 100 includes: forming 105 a GaN (gallium nitride) substrate having an upper surface; forming 110 a plurality of spaced-apart first metal contacts directly on the upper surface of the GaN substrate, the first metal contacts spaced apart by exposed portions of the upper surface; forming 115 a layer of insulating GaN on the exposed portions of the upper surface; forming 120 a stressor layer on the contacts and the layer of insulating GaN, the stressor layer having a first surface; forming 125 a handle substrate on the first surface of the stressor layer; spalling 130 the GaN substrate that is located beneath the stressor layer to separate layer of GaN and expose a stressor layer second surface and removing the handle substrate; bonding 135 the first surface of the stressor layer to a thermally conductive substrate; forming 140 a plurality of vertical channels having opposing sidewalls through the insulating GaN to provide exposed portions of the layer of insulating GaN to define a plurality of device structures, each device structure comprising at least one contact; removing 145 the exposed portions of the layer of insulating GaN to electrically isolate the device structures; forming 150 an ohmic contact layer on the stressor layer second surface; and forming 155 a plurality of second metal contacts on the ohmic contact layer. The elements of method 100 are explained in greater detail below.

Referring to FIG. 1, the method 100 includes forming 105 a GaN substrate 2 having an upper surface 4. The GaN substrate 2 may include any suitable GaN substrate form, including bulk GaN or GaN that is deposited or grown on a supporting substrate 8. The GaN substrate comprises a semiconductor material, the semiconductor material can be doped, undoped or contain doped regions and undoped regions. The semiconductor material that can be employed as the GaN substrate 2 can be single-crystalline (i.e., a material in which the crystal lattice of the entire sample is continuous and unbroken to the edges of the sample, with no grain boundaries). In another embodiment, the semiconductor material that can be employed as the GaN substrate 2 can be polycrystalline (i.e., a material that is composed of many crystallites of varying size and orientation; the variation in direction can be random (called random texture) or directed, possibly due to growth and processing conditions). In yet another embodiment, the semiconductor material that can be employed as the GaN substrate 2 can be amorphous (i.e., a non-crystalline material that lacks the long-range order characteristic of a crystal). Typically, the semiconductor material that can be employed as the GaN substrate 2 is a single-crystalline material.

Alternately, the GaN substrate 2 may be formed or deposited on a suitable supporting substrate 8 of another material, such as a sapphire, silicon carbide, zinc oxide, silicon, ceramic, or glass substrate. The glass can be an $SiO_2$-based glass which may be undoped or doped with an appropriate dopant. Examples of $SiO_2$-based glasses that can be employed as the supporting substrate 8 include undoped silicate glass, borosilicate glass, phosphosilicate glass, fluorosilicate glass, and borophosphosilicate glass. When the supporting substrate 8 comprises a ceramic, the ceramic may include various inorganic, nonmetallic solid such as, for example, a metallic oxide including, but not limited to, alumina, beryllia, ceria and zirconia, a metallic non-oxide including, but not limited to, a metallic carbide, boride, nitride, or silicide; or composites that include combinations of oxides and non-oxides. In some embodiments of the present disclosure, the first or upper surface 4 of the GaN substrate 2 can be cleaned prior to further processing to remove surface oxides and/or other organic or inorganic contaminants therefrom. In one embodiment, the substrate 2 is cleaned by applying a solvent to the upper surface 4, such as, for example, acetone and isopropanol, which is capable of removing certain organic or particulate contaminants and/or surface oxides from the upper surface 4 of the GaN substrate 2.

Forming 105 the GaN substrate 2 may be accomplished using any suitable process or combination of processes to make any suitable form, including in bulk form as a gallium nitride ingot or boule or crystal, including a single crystal. Alternately, the GaN substrate 2 may be formed or deposited on a suitable support substrate 8 of another material, such as a sapphire, silicon carbide, silicon or zinc oxide substrate. The GaN substrate may be formed by any suitable process, such as, for example, chemical vapor deposition (e.g. MOCVD), physical vapor deposition, molecular beam epitaxy, thermal cracking, plasma deposition using radio frequency (RF) plasmas, electron cyclotron resonance plasmas, and Kaufman ion source plasmas. The GaN substrate 2 may receive any suitable processing and have any suitable dopant structure, including dopants and processes that provide a p-type or n-type GaN semiconductor material, particularly dopants and processes that provide conductive p-type GaN semiconductors. The GaN substrate 2 may have any suitable thickness. In one embodiment, the thickness will be at least about 25 µm, and more particularly at least about 50 µm, and even more particularly at least about 100 µm.

Figure 2:
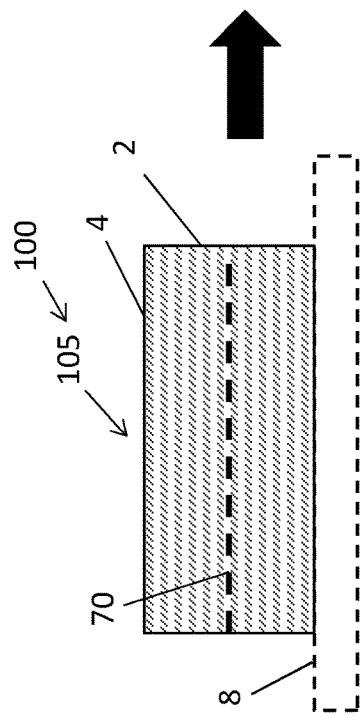
FIG. 2 is a cross-sectional illustration of an embodiment of forming a plurality of spaced-apart first metal contacts according to a first embodiment of a method of making a GaN device.

Referring to FIG. 2, the method 100 includes forming 110 a plurality of spaced-apart first metal contacts 6 directly on the upper surface 4 of the GaN substrate 2. Any suitable number of first metal contacts 6 may be formed directly on the upper surface 4. The first metal contacts 6 may be formed in any suitable pattern, including as an orthogonal array of spaced apart contacts. Adjacent first metal contacts 6 may be spaced-apart by any suitable distance. First contacts 6 may be made from any suitable electrically and thermally conductive material, including any suitable metal, such as, for example, pure metals or alloys comprising pure Ag, Au, Pd, Pt, Ni, W, Cr, Nb, Al, Ta, Cu, Mg, or Mo, or alloys of these metals with themselves (e.g. Ni/Au or Ni/Ag alloys) or with other metals, or any combination of the aforementioned metals. In one embodiment, first metal contacts 6 will be a good electrical and thermal conductor, such as pure metals or alloys comprising Al, Cu, Au, Ag, Mo, Zn, or Ni, or a combination thereof. First contact 6 will generally extend over a significant portion of the device structure to enable and promote transfer of heat away from the GaN device structure, which in one embodiment will include 90% of the surface area of the GaN device with which it is associated, and more particularly 75% of the surface area, and more particularly about 50% of the surface area. First contact 6 may have any suitable layer thickness, which in one embodiment will include 0.01 to 500 µm, and more particularly 0.05 to 50 µm, and even more particularly 0.1 to 50 µm, and still more particularly 0.5 to 25 µm. In one embodiment, forming 110 of metal contacts may include deposition of a metal contact adhesion layer 7 on upper surface 4 prior to deposition of the metal layer used to form first metal contacts 6. The metal contact adhesion layer 7 may include any metal that promotes or enhances the adhesion of the metal layer used to form first metal contacts 6 on the upper surface 4 of the GaN substrate 2. Example first metal contacts 6 that are ohmic to p-type GaN include thin Ni (1 to 5 nm) and Au or Ag (5 to 100 nm) bilayers that are subsequently annealed at 350-550° C. in an oxygen-containing environment. Example first metal contacts 6 that are ohmic to n-type GaN include Ti (50 to 100 nm) and Al (100 to 500 nm) bilayers that are subsequently annealed at 350-550° C. in an inert environment.

Forming 110 a plurality of spaced-apart first metal contacts 6 may be formed using any suitable conventional method for forming metal contacts on semiconductor materials, including various additive or subtractive methods, or combinations thereof. In one example of a subtractive method, a metal layer may be deposited directly over the entire upper surface 4 using conventional metal deposition methods, such as sputtering, thermal or electron beam evaporation, plating and the like. The metal layer may then be covered with a layer of photoresist material and patterned to define portions of the photoresist material corresponding to the desired first metal contacts 6 and remove the remainder of the photoresist material. The metal layer may then be etched, using wet chemical etchants or dry etching by sputtering, or other conventional dry etching techniques, to remove the portions of the metal layer that are not covered by photoresist thereby defining first contacts 6. The definition of first metal contacts 6 also defines exposed portions 10 of the upper surface 4. Alternatively, forming 110 a plurality of spaced-apart first metal contacts may be formed by applying a contact mask prior to metal deposition, or by using a photolithographic lift-off process.

Figure 3:
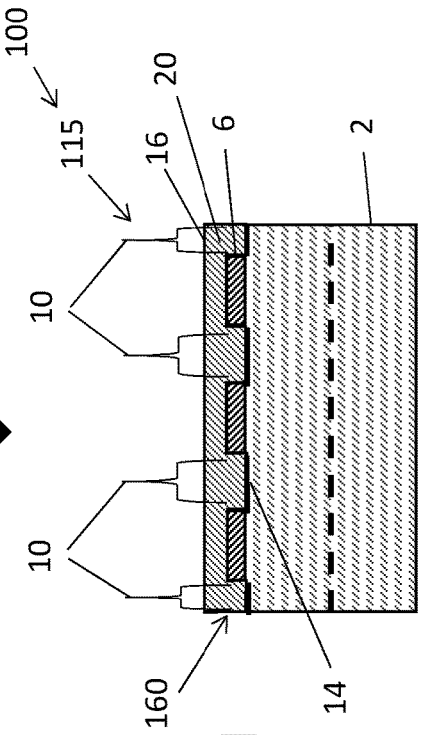
FIG. 3 is a cross-sectional illustration of an embodiment of forming a layer of insulating GaN according to a first embodiment of a method of making a GaN device.

Referring to FIG. 3, the method 100 includes forming 115 a layer of insulating GaN 14 on the exposed portions 10 of the upper surface 4. In one embodiment, forming 115 a layer of insulating GaN 14 on the exposed portions 10 of the upper surface 4 comprises inducing microstructural changes in a layer proximate the upper surface 4. In this embodiment, the microstructural changes in the upper surface 4 may be produced by introducing the exposed portions 10 to a microstructural damage inducing constituent, such as, for example, exposure to a plasma or other source of energetic particles, such as, for example, by plasma etching the upper surface using sputtering, reactive ion etching or other techniques to bombard the upper surface 4 with highly energetic gas ions (e.g. Ar gas ions) or other species having an energy sufficient to induce microstructural changes (e.g. damage) in the GaN. This may include, for example, altering the dislocation structure or dislocation density in a layer proximate to upper surface 4 to provide the layer of insulating GaN 14, such as by increasing the dislocation density. In one embodiment (not shown), deposition of a metal layer, such as a titanium layer, is not needed to affect creation of the layer of insulating GaN 14 such that the stressor layer 18 may be deposited directly onto the exposed portions 10 of the upper surface 4 and the first metal contacts 6. The nature of the microstructural damage that leads to conversion of the GaN to insulating is not well understood, however the near surface stoichiometry of the binary alloy appears to be altered during plasma bombardment rendering the surface (up to ~20 nm for 300W RF Ar plasma) Ga rich. For p-type GaN, the Mg dopant is deactivated by the presence of H, therefore a two-step conversion may be used wherein plasma damage is introduced to render the p-GaN surface insulating, then a second step of exposure to H may be performed to further suppress electrical conduction.

In another embodiment, forming 115 the layer of insulating GaN 14 on the exposed portions 10 of the upper surface 4 comprises depositing 160 a metal layer 16 on the first metal contacts 6 and the exposed portions 10 of the upper surface 4, wherein depositing 160 the metal layer 16 comprises forming 115 the layer of insulating GaN 14 on the exposed portions 10 of the GaN substrate 2. In this embodiment, the deposition of the metal layer provides the microstructural damage inducing constituent, such as, for example, exposure to a plasma or other source of energetic particles, such as, for example, bombarding the upper surface 4 with highly energetic gas ions (e.g. Ar gas ions) from the plasma used for sputtering the metal or the sputtered metal atoms that collide with the surface during deposition or other species having an energy sufficient to induce microstructural changes (e.g. damage) in the upper surface 4 of the GaN substrate 2. This may also include, for example, altering the dislocation structure or dislocation density or stoichiometry in a layer proximate upper surface 4 to provide the layer of insulating GaN 14, such as by increasing the dislocation density or altering the stoichiometry. In one embodiment, the metal layer 16 is a adhesion promoting metal layer 20 promoting the adhesion of the stressor layer 18 to the exposed portions 10 of the upper surface 4 and the first metal contacts 6. Metal layer 16 may include any suitable metal. Metals suitable for use as adhesion promoting metal layer comprise pure Ti, Cr, Ta, W, Cu, Pt, Al, Au, or Ni, or alloys of these metals with themselves (e.g. Ti/W alloys) or with other metals, or any combination of the aforementioned metals. The metal layer 16 or adhesion promoting metal layer 20 may comprise a single layer or it may include a multilayered structure comprising at least two layers of different metals. The metal layer 16 may also be selected to provide a diffusion barrier to limit or prevent diffusion into one or more of the GaN substrate 2, metal contacts 6, and/or stressor layer 18. The use of pure Ti and Ti alloys, such as Ti/W alloys, is particularly useful in the methods 100, 200 disclosed herein because Ti can be used to damage the GaN and then selectively removed by various forms of etching (e.g. wet chemical and plasma etching) relative to the GaN substrate 2, as well as the materials used for metal contacts 6 and stressor layer 18, to provide electrical isolation and define the device structures described herein. In addition, pure Ti and Ti alloys can also be readily oxidized in situ to provide an electrical insulator and thereby also provide electrical isolation and define the device structures described herein. The metal layer 16 or adhesion promoting metal layer 20 can be formed at room temperature (15° C.-40° C.) or above. In one embodiment, the metal layer 16 or adhesion promoting metal layer 20 is formed at a temperature which is from 20° C. to 180° C. In another embodiment, the metal layer 16 or adhesion promoting metal layer 20 is formed at a temperature which is from 20° C. to 60° C. The metal layer 16 or adhesion promoting metal layer 20 can be formed utilizing deposition techniques that are well-known to those skilled in the art. For example, the metal layer 16 or adhesion promoting metal layer 20 can be formed by sputtering, chemical vapor deposition, plasma enhanced chemical vapor deposition, chemical solution deposition, physical vapor deposition, or plating. When sputter deposition is employed for depositing 160, the sputter deposition process may further include an in-situ sputter clean or etch process before the deposition to promote the creation of the layer of insulating GaN 14 as described above. Thus, forming 115 the layer of insulating GaN 14 may include forming 115 that includes only exposure to energetic particles (e.g. plasma etching) as described above, or that includes only deposition 160 of metal layer 16 as described above, or that involves the use of both processes. Depositing 160 the metal layer 14 may include sputter deposition, such as, for example, by DC, RF, ion beam, ion-assisted, or reactive sputtering, of the metal layer 16, including adhesion promoting metal layer 20. Without being limited by theory, it is believed that the energy of the metal atoms striking the surface during sputtering damages or otherwise alters the GaN microstructure proximate the upper surface 4, thereby causing the GaN, particularly conductive p-type GaN, to become nonconductive and electrically insulating, thereby creating a layer of insulating GaN 14. In one embodiment, this may include the introduction of a Ga-rich region in the GaN by deposition of the metal atoms onto the upper surface 4, and may result from the impact of the metal atoms themselves, or the carrier atoms used to create the plasma, with upper surface 4. The metal layer 16 or adhesion promoting metal layer 20 typically has a thickness of from 5 nm to 1000 nm, and more particularly 50 nm to 500 nm, and even more particularly a thickness of from 100 nm to 300 nm, with a thickness of from 100 nm to 150 nm being more typical. Other thicknesses for the metal layer 16 that are below and/or above the aforementioned thickness ranges can also be employed in the present disclosure.

Figure 4:
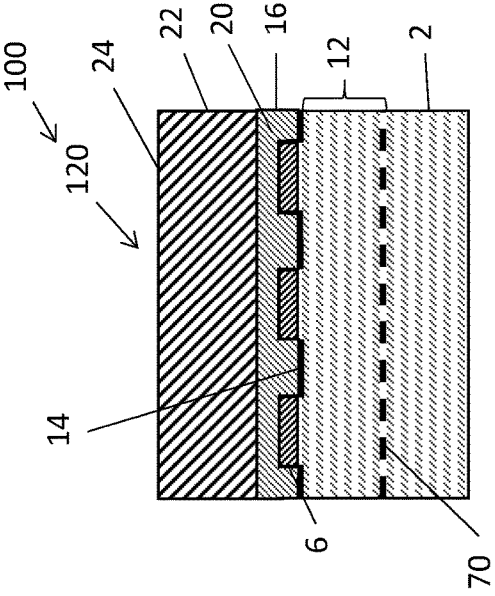
FIG. 4 is a cross-sectional illustration of an embodiment of forming a stressor layer according to a first embodiment of a method of making a GaN device.

Referring to FIG. 4, the method 100 includes forming 120 a stressor layer 22 on the first metal contacts 6 and the layer of insulating GaN 14, the stressor layer having a first surface 24. The first surface 24 is disposed outwardly away from the GaN substrate 2. The stressor layer 22 comprises a metal, including various pure metals and metal alloys. In one embodiment, the metal may comprise Ni, Ti, Mo, Cr, Fe, or W, or a combination thereof. The stressor layer 22 may be a single metal layer, or it may include a multilayered structure comprising at least two layers of different metals. The stressor layer 22 may optionally be employed in conjunction with an edge exclusion material to control the spalling of the GaN substrate 2 that is disposed between the stressor layer 22 and the GaN substrate 2, and in certain embodiments between the stressor layer 22 and the metal layer 16. Thin substrate fabrication using stress-induced substrate spalling and the use of an edge exclusion material to control spalling by reducing edge-related substrate breakage during spalling are disclosed in U.S. Pat. Nos. 8,247,261 and 8,748,296, which are incorporated herein by reference in their entirety.

The stressor layer 22 has a fracture toughness that is greater than the fracture toughness of the GaN substrate 2, and is used to induce a stress within the GaN substrate 2 that is sufficient to fracture the GaN material a predetermined distance 12 or depth below the substrate surface. The depth may be selectively controlled to establish a predetermined thickness of the GaN substrate 2. Fracture toughness is a property which describes the ability of a material containing a crack to resist fracture. Fracture toughness is denoted $K_{IC}$. The subscript Ic denotes mode I crack opening under a normal tensile stress perpendicular to the crack, and c signifies that it is a critical value. Mode I fracture toughness is typically the most important value because spalling mode fracture along a predetermined fracture or spalling path 70 (e.g. FIG. 4) usually occurs at a location in the substrate where mode II stress (shearing) is zero, and mode III stress (tearing) is generally absent from the loading conditions. Fracture toughness is a quantitative way of expressing a material's resistance to brittle fracture when a crack is present.

Referring to FIG. 4, there is illustrated the structure of FIG. 3 after forming stressor layer 22 over the upper surface of metal layer 16, such as titanium. Alternately, stressor layer 22 may be formed directly over the metal contacts 6 and insulating GaN layer 14.

As mentioned above, stressor layer 22 is located atop the upper surface 4 of GaN substrate 2. In one embodiment and when no metal layer 16 or adhesion promoting metal layer 20 is present, the stressor layer 22 is in direct contact with the metal layer 16. In another embodiment and when a metal layer 16 is present, the stressor layer 22 is in direct contact with the upper surface of the metal or metallic adhesion layer 20.

In accordance with the present disclosure, the stressor layer 22 that is formed atop upper surface 4 of the GaN substrate 2 has a critical thickness and stress value that cause spalling mode fracture to occur within the GaN substrate 2. By "spalling mode fracture" it is meant that a crack is formed within the GaN substrate 2 and the combination of loading forces maintain a crack trajectory at a depth below the stressor/substrate interface. By critical condition, it is meant that for a given stressor material and substrate material combination, a thickness value and a stressor value for the stressor layer is chosen that render spalling mode fracture possible (can produce a $K_I$ value greater than the $K_{IC}$ of the substrate).

Specifically, the thickness of the stressor layer 22 is chosen to provide the desired predetermine fracture or spalling path 70 at predetermined fracture distance 12 or depth within the GaN substrate 2. For example, if the stressor layer 22 is chosen to be Ni, then fracture will occur at a depth below the stressor layer 22 roughly 2 to 3 times the Ni thickness. The stress value for the stressor layer 22 is then selected to satisfy the critical condition for spalling mode fracture. This can be estimated by inverting the empirical equation given by $t^* = \{(2.5 \times 10^6 (K_{Ic}^{3/2})]/\sigma^2$, where $t^*$ is the critical stressor layer thickness (in microns), $K_{Ic}$ is the fracture toughness (in units of $MPa \cdot m^{1/2}$) of the base substrate 10 and $\sigma$ is the stress value of the stressor layer (in MPa or megapascals). The above expression is a guide, in practice, spalling can occur at stress or thickness values up to 20% less than that predicted by the above expression. In the case of spalling GaN layers formed on a different substrate, such as SiC or sapphire, the depth of spalling may be determined by the thickness of the epitaxially grown GaN layer. In this case, there may be sufficient energy to fracture GaN, but not the underlying sapphire or SiC which has a higher fracture toughness. As a result, fracture typically proceeds along the GaN/substrate growth interface.

In accordance with the present disclosure, the stressor layer 22 is under tensile stress while present on the GaN substrate 2 at the spalling temperature. The stressor layer 22 may comprise a single stressor layer, or a multilayered stressor structure including at least two layers of different stressor material can be employed.

In one embodiment, the stressor layer 22 comprises a metal. Stressor layer 22 may include any metal suitable for stressing the GaN substrate sufficient to cause spalling, and in one embodiment, may include, for example, Ni, Ti, Mo, Cr, Fe, or W. Alloys of these metals can also be employed. In one embodiment, the stressor layer 22 includes at least one layer consisting of Ni. In one embodiment, the stressor layer 22 employed in the present disclosure is formed at a temperature which is at room temperature (15° C.–40° C.). The stressor layer 22 may have any suitable thickness, including a thickness of from 3 µm to 50 µm, with a thickness of from 5 µm to 35 µm being more typical. Other thicknesses for a metallic stressor layer that are below and/or above the aforementioned thickness ranges can also be employed in the present disclosure.

Figure 5:
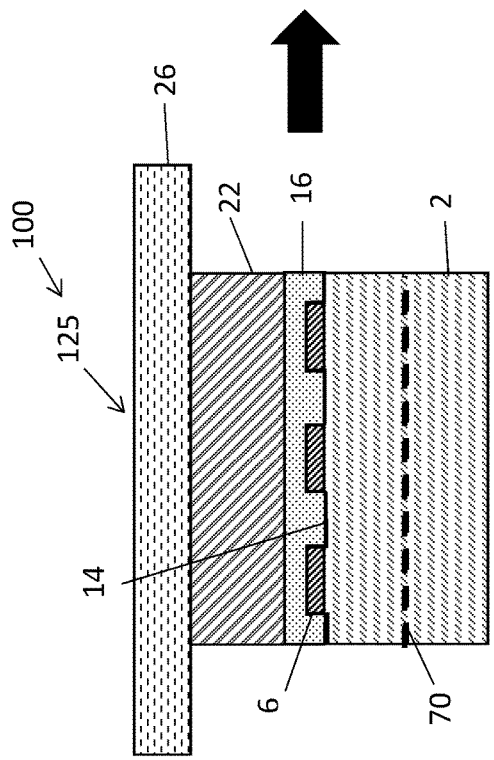
FIG. 5 is a cross-sectional illustration of an embodiment of forming a handle substrate according to a first embodiment of a method of making a GaN device.

The method 100 also includes forming 125 a handle substrate 26 on the first surface 24 of the stressor layer 22. Referring to FIG. 5, there is illustrated the structure of FIG. 4 after forming 125 a handle substrate 26 on the stressor layer 22. The handle substrate 26 employed in the present disclosure comprises any flexible material which has a minimum radius of curvature of less than 30 cm. Illustrative examples of flexible materials that can be employed as the handle substrate 26 include a metal foil or a polyimide foil. Other examples of flexible materials that can be employed as the optional handle substrate 26 include polymers, tapes and spin-on materials.

The handle substrate 26 can be used to provide better fracture control and more versatility in handling the spalled portion 28 of the GaN substrate 2. Moreover, the handle substrate 26 can be used to guide the crack propagation during the spalling process of the present disclosure. The handle substrate 26 of the present disclosure is typically, but not necessarily, formed at room temperature (15° C.-40° C.).

The handle substrate 26 can be formed utilizing deposition techniques that are well-known to those skilled in the art including, for example, dip coating, spin-coating, brush coating, sputtering, chemical vapor deposition, plasma enhanced chemical vapor deposition, chemical solution deposition, physical vapor deposition, or plating, or a combination thereof. Handle substrate 26 may also be formed as a stand-alone film or tape, such as a polymer tape (e.g. polyimide, polyester, or polypropylene) with an integral adhesive layer and forming 125 may include application by pressing the handle substrate 26 against the stressor layer 22 to adhere the adhesive layer. Alternately a separate adhesive may be applied to the stressor layer 22 or handle layer 26 and forming 125 may include application by pressing the handle substrate 26 against the stressor layer 22 with the adhesive disposed between them.

The handle substrate 26 may have any suitable thickness. In one embodiment, handle substrate 26 has a thickness of from 1 µm to 3 mm, and more particularly a thickness of from 25 µm to 120 µm. Other thicknesses for the handle substrate 26 that are below and/or above the aforementioned thickness ranges can also be employed in the present disclosure.

Figure 6:
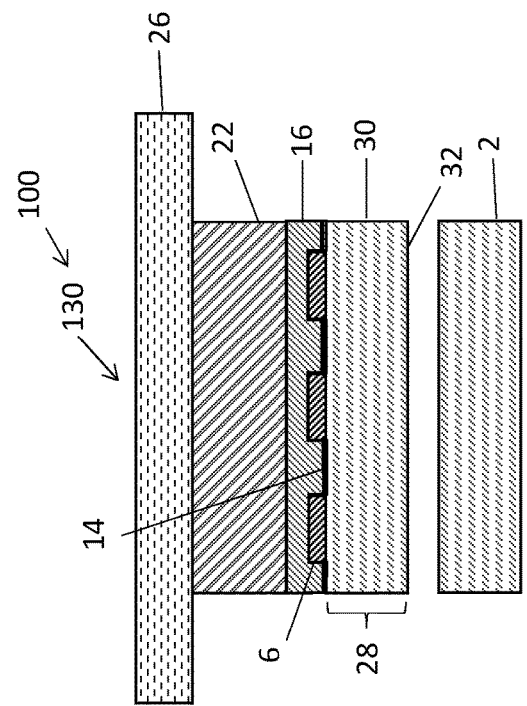
FIG. 6 is a cross-sectional illustration of an embodiment of spalling the GaN substrate according to a first embodiment of a method of making a GaN device.

The method 100 also includes spalling 130 the GaN substrate 2 that is located beneath the stressor layer 22 to separate a GaN layer 30 as spalled portion 28 and expose a stressor layer second surface 32 as illustrated in FIG. 6 and removing the handle substrate 26. Referring to FIG. 6, there is illustrated the structure of FIG. 5 after spalling 130 in which a spalled portion 28 of the GaN substrate 28 is removed from the initial GaN substrate 2 as the layer of GaN 30 having a predetermined thickness. The portion of the GaN substrate 28 that is removed from the initial GaN substrate 2 is referred to herein as spalled portion 28; the remaining portion of the GaN substrate is designated as 2' in FIG. 6.

The spalling process can be initiated at room temperature or at a temperature that is less than room temperature. In one embodiment, spalling 130 is performed at room temperature (i.e., 20° C. to 40° C.). In another embodiment, spalling 130 is performed at a temperature less than 20° C. In a further embodiment, spalling occurs at a temperature of 77° K or less. In an even further embodiment, spalling 130 occurs at a temperature of less than 206° K. In still yet another embodiment, spalling 130 occurs at a temperature from 175° K to 130° K.

When a temperature that is less than room temperature is used, the less than room temperature spalling 130 process can be achieved by cooling the structure down below room temperature utilizing any cooling means. For example, cooling can be achieved by placing the structure in a liquid nitrogen bath, a liquid helium bath, an ice bath, a dry ice bath, a supercritical fluid bath, or any cryogenic environment liquid or gas.

When spalling 130 is performed at a temperature that is below room temperature, the spalled portion 28 is returned to room temperature by allowing the spalled portion 28 structure to slowly warm up to room temperature by allowing the same to stand at room temperature. Alternatively, the spalled portion 28 can be heated up to room temperature utilizing any heating means.

Figure 7:
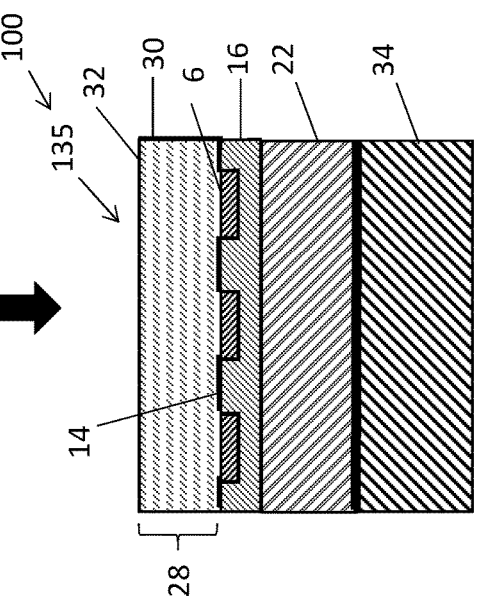
FIG. 7 is a cross-sectional illustration of an embodiment of bonding the first surface of the stressor layer to a thermally conductive substrate according to a first embodiment of a method of making a GaN device.

Referring to FIG. 7, there is illustrated the structure of FIG. 6 after removing the handle substrate 26 and inverting the remaining portion of the device structure. The handle substrate 26 can be removed from the spalled portion 28 of the GaN substrate 2 utilizing conventional techniques well known to those skilled in the art. For example, and in one embodiment, aqua regia ($HNO_3$/HCl) can be used for removing the handle substrate 26 from the spalled portion 28 of the GaN substrate 2. In another example, UV or heat treatment is used to remove the handle substrate 26.

The thickness of the spalled portion 28 of the GaN substrate 2 shown in FIG. 7 varies depending on the material of the stressor layer 22 and the GaN substrate 2. In one embodiment, the spalled portion 28 of the GaN substrate 2 has a thickness of less than 100 microns. In another embodiment, the spalled portion 28 of the GaN substrate 2 has a thickness of less than 50 microns, and more particularly less than 30 microns.

Figure 8:
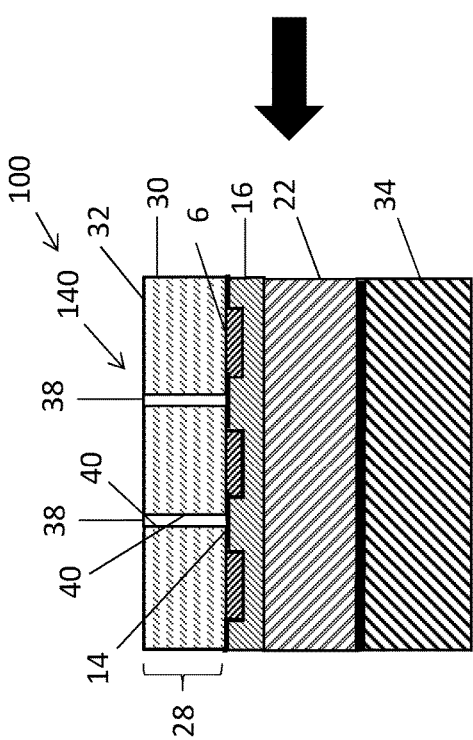
FIG. 8 is a cross-sectional illustration of an embodiment of forming a plurality of channels in the insulating GaN layer according to a first embodiment of a method of making a GaN device.
Figure 10:
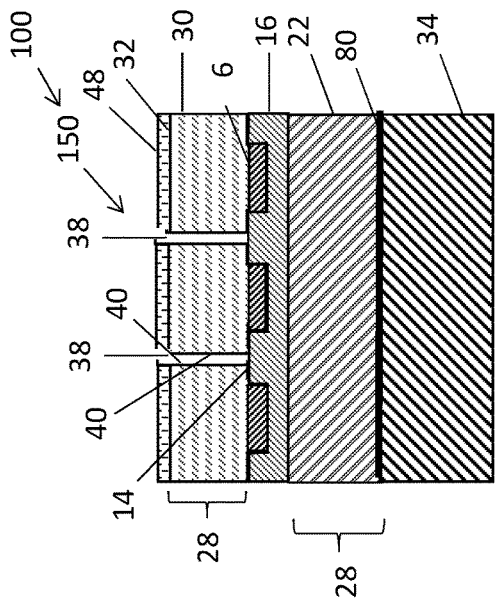
FIG. 10 is a cross-sectional illustration of an embodiment of forming an ohmic contact layer on the stressor layer second surface according to a first embodiment of a method of making a GaN device.

Referring to FIG. 8, the method 100 also includes bonding 135 the first surface 24 of the stressor layer 22 to a thermally conductive substrate 34. The thermally conductive substrate 34 may be used to remove heat from the device structure 36 during operation. In one embodiment, the substrate 34 may include any suitable thermally conductive material, including various metals, thermally conductive polymers, thermally conductive ceramics, or thermally conductive cermets, diamond or conductive diamond like carbon, or a combination thereof. Any suitable metal may be used. In an embodiment, metals may include Fe, Cu, Al, Ni, or alloys thereof. In an embodiment, thermally conductive polymers may include various filled or unfilled polymers, including metal-filled polymers, carbon-filled polymers, or polymers filled with various thermally conductive compounds, including various ceramic materials, such as epoxies that are filled with conductive AlN particles. Ceramics may comprise sapphire ($Al_2O_3$), SiC, and AlN. The thermally conductive substrate 34 may have any suitable size and/or thickness necessary to incorporate the device structure 36 into a GaN device, including the exemplary electronic devices described herein. The substrate 34 may include a single material or layer of material, or a multilayer material, including a multilayer laminate, such as a conventional printed circuit or printed wiring board (e.g. a Cu, glass, polymer resin laminate). In one embodiment, the substrate 34 may include a multilayer metal/ceramic substrate (e.g. Cu or Au/alumina (sapphire). The substrate 34 may have a size and/or thickness necessary to incorporate a single device structure 36 or a plurality of device structures 36, including an M×N array that includes any number of device structures 36, such as may be used to develop an LED display. Bonding 135 may be accomplished using any suitable bonding material 42 or method of bonding to form a metallurgical bond 80. In one embodiment, the bonding material 42 includes a solder layer 44 having a lower melting point than the substrate 34 and stressor layer 22 and the solder is melted, reflowed between substrate 34 and stressor layer 22, and solidified to join them. In one embodiment, the solder 44 may include a NiAu or a NiAg solder, for example.

The method 100 also includes forming 140 a plurality of vertical channels 38 having opposing sidewalls 40 from the stressor layer second surface 32 through the insulating GaN layer 30 to provide exposed portions 46 of the layer of insulating GaN 14 to define a plurality of device structures 36, each device structure 36 comprising at least one first metal contact 6. Forming 140 a plurality of vertical channels 38 can be achieved by lithography and etching. Lithography includes applying a layer of photoresist (not shown) atop the GaN layer 30, exposing the photoresist to a desired pattern of radiation and developing the exposed photoresist utilizing a conventional photoresist developer to selectively open areas of the photoresist over the desired vertical channels 38 and leave the layer of photoresist in other areas. Other patterning methods may also be employed, including the application of various metal masks. The patterned GaN layer 30 may then be etched in the exposed regions to define the vertical channels 38. Etching may include any suitable form of etching, including various wet and dry etching methods. Wet etching may include, for example, techniques including photo-enhanced electrochemical (PEC), wet etch, photo-assisted cryogenic etch (PAC), crystallographic wet etch, photo-assisted anodic etch, wet chemical digital etch of GaN at room temperature, and a PEC binary etch using $K_2S_2O_8$ and KOH, and may employ acid and base etchants, including KOH, NaOH, HCl, $H_3PO_4$, citric acid/$H_2O_2$, tartaric acid/ethylene glycol, and $K_2S_2O_8$/KOH, for example. Dry etching techniques may include sputtering etching, reactive ion etching, ion beam etching, plasma etching or laser ablation, for example. The vertical channels 38 may have any suitable width between opposing sidewalls 40 and channel length. In one embodiment, the channel width between opposing sidewalls 40 is 5 to 1000 μm, and more particularly 10 to 300 μm. The vertical channel 38 depth extends from the stressor layer second surface 32 through the insulating GaN layer 30 to provide exposed portions 46 of the layer of insulating GaN 14, which is substantially the entire thickness of the GaN layer 30.

The method 100 further includes removing 145 the exposed portions 46 of the layer of insulating GaN 14 to electrically and thermally isolate the device structures 36 from one another. In one embodiment, removing 145 the exposed portions 46 of the layer of insulating GaN 14 may include extension of forming 140, such as by using the same etching process selected and used for forming 140 as described above, to also remove the exposed portions 46 of the layer of insulating GaN 14. This may be employed, for example, where the GaN layer 30 and the exposed portions 46 of the layer of insulating GaN 14 have similar etching rates in the etchant that is employed. In other embodiments, it may be desirable to employ an etchant for removing 145 that is different than the etchant used for forming 140. This may be employed, for example, where the GaN layer 30 and the exposed portions 46 of the layer of insulating GaN 14 have different etching characteristics (e.g. etching rate) in the etchant that is used for forming 140, such that it is desirable to select a different etchant for removing 145 that has improved performance in the layer of insulating GaN 14 versus the GaN layer 30, such as a higher etching rate, improved isotropic or anisotropic etching performance (i.e. enhanced or reduced undercut), or etch selectivity versus the underlying material, which may be the stressor layer 22 or the metal layer 16.

The method 100 also includes forming 150 an ohmic contact layer 48 on the stressor layer second surface 32. Any suitable low resistance ohmic contact may be used to allow charge to flow easily in both directions between the GaN layer 30 and second metal contacts 50, without blocking due to rectification or excess power dissipation due to voltage thresholds. The layer may be deposited and formed by sputtering, chemical vapor deposition, plasma enhanced chemical vapor deposition, chemical solution deposition, physical vapor deposition, or plating, or a combination thereof. Any suitable material that provides an ohmic contact 50 may be used. In one embodiment, the ohmic contact 50 comprises indium tin oxide, aluminum-doped zinc oxide, indium-doped cadmium oxide, a transparent conductive polymer, or carbon nanotubes, or a combination of the aforementioned materials.

The method 100 also includes forming 155 a plurality of second metal contacts 48 on the ohmic contact layer 50. The second metal contacts 48 may be formed from a metal layer (not shown) that is deposited and formed by any suitable metal layer deposition method, including sputtering, chemical vapor deposition, plasma enhanced chemical vapor deposition, chemical solution deposition, physical vapor deposition, or plating, or a combination thereof. Any suitable material that may be used to provide a second metal contact 48 may be used. In one embodiment, the second metal contact 48 may include pure Ag, Au, Pd, Pt, Ni, W, Cr, Nb, Al, Ta, Cu, Mg, or Mo, or alloys of these metals with themselves (e.g. Ni/Al or Ti/Al alloys) or with other metals, or any combination of the aforementioned metals. Desirable second metal contacts 48 are good electrical conductors that are resistant to environmental degradation, such as corrosion or oxidation. In one embodiment, forming 155 a plurality of second metal contacts 48 on the ohmic contact layer 50 can be achieved by lithography and etching of the metal layer. Lithography includes applying a layer of photoresist (not shown) atop the metal layer, exposing the photoresist to a desired pattern of radiation and developing the exposed photoresist utilizing a conventional photoresist developer to selectively open areas of the photoresist over the desired second metal contacts 48 and leave the layer of photoresist in other areas. Other patterning methods may also be employed, including the application of various metal (shadow) masks. The metal layer may then be etched in the exposed regions to define the second metal contacts 48. Etching may include any suitable form of etching, including various wet and dry etching methods. The second electrical contacts 48 are configured for attachment of electrical interconnections to electrical circuits that utilize the device structures 36.

In one embodiment, method 100 may optionally further comprise etching 165 to remove the insulating GaN layer 30 proximate the channels 38 and define a final channel width. Etching 165 to remove the insulating GaN layer 30 may be performed using the etching processes described above regarding forming 140 the plurality of vertical channels 38.

In an embodiment, method 100 may also optionally include doping 170 the GaN layer 30 to form a p-type region or an n-type region therein, or a combination thereof. Doping 170 may be performed after spalling 130 the GaN substrate 2 to separate the GaN layer 30 as spalled portion 28 and expose the a stressor layer second surface 32. N-type doping can be achieved by adding elements such as, for example, silicon or germanium. P-type doping may be achieved, for example, by adding Mg. Doping 170 may be performed by any suitable method of doping, including ion implantation.

While many combinations of the materials described above are contemplated, in one embodiment GaN layer 30 comprises a GaN LED structure including p, n, and multi quantum well regions, the metal layer 16 comprises titanium, the stressor layer comprises nickel, the first metal contacts comprise nickel and silver, and the ohmic contacts comprise a layer of an optically transparent, electrical conductive material comprising indium tin oxide, aluminum-doped zinc oxide, indium-doped cadmium oxide, a transparent conductive polymer, or carbon nanotubes.

Figure 11:
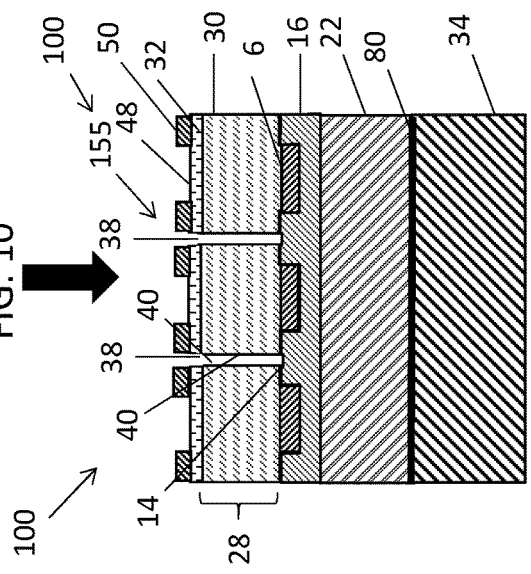
FIG. 11 is a cross-sectional illustration of an embodiment of forming a plurality of second metal contacts on the ohmic contact layer according to a first embodiment of a method of making a GaN device and an embodiment of the structure of the GaN device made thereby.
Figure 9:
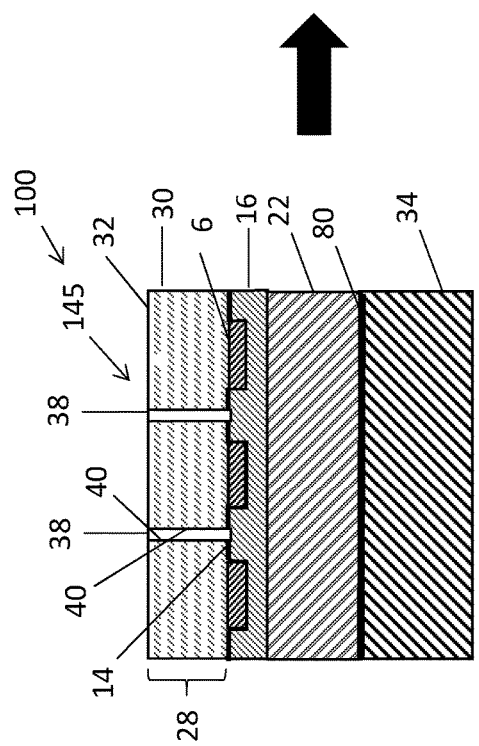
FIG. 9 is a cross-sectional illustration of an embodiment of removing the exposed portions of the layer of insulating GaN to electrically isolate the device structures according to a first embodiment of a method of making a GaN device.

In one embodiment, method 100 may optionally include forming a layer of insulating GaN 52 (not shown) on the opposing sidewalls 40 of the channels 38 of the embodiment of FIG. 11. Forming 175 the layer of insulating GaN 52 on the opposing sidewalls 40 may be performed using the methods described herein for forming the layer of insulating GaN 14. The thickness of the layer of insulating GaN 52 may be any suitable thickness, including those described herein for the layer of insulating GaN 14.

In one embodiment, method 100 may optionally include etching the stressor layer second surface 32 of the GaN layer 30 prior to forming the ohmic contact layer 50. Etching 180 may be employed to remove damage in the microstructure of the GaN layer 30 proximate the stressor layer second surface 32 resulting from spalling 130, for example. Etching 180 may be performed using the etching processes described above regarding forming 140 the plurality of vertical channels 38, and may be performed concurrently with forming 140 or etching 165, for example, or may be performed as a separate step.

In one embodiment, a second method 200 of making a GaN device 10 is disclosed. Method 200 uses a number of operations that are the same or similar to those of method 100 and incorporates various elements, structures, and features that are common to those of the GaN device 10 of method 100. Thus, references below to various elements, structures, and features employ the same reference numerals. Similarly, the operations of method 200 are explained in a number of instances below using comparative references to the operations of method 100 for brevity.

Referring to FIGS. 12-25, in one embodiment, method 200 includes: forming 205 a GaN substrate 2 having an upper surface 4; forming 210 a plurality of spaced-apart first metal contacts 6 directly on the upper surface 4 of the GaN substrate 2, the contacts spaced apart by exposed portions 10 of the upper surface 4; forming 215 a plurality of first vertical channels 38 having first opposing sidewalls 40 in the exposed portions 10 of the upper surface 4 partially through the GaN substrate 2 to define a plurality of device structures 36, each device structure configured to comprise at least one contact 6; forming 220 a metal layer 16 on the contacts 6, the exposed portions 10 of the upper surface 4 and the first opposing sidewalls 40, the forming of the metal layer forming a layer of insulating GaN 14, 52 on the exposed portions 10 of the upper surface and the first opposing sidewalls 40 (and channel bottom); forming 225 a stressor layer 22 on the metal layer 16, the stressor layer 22 having a first surface 24; forming 230 a handle substrate 26 on the first surface 24 of the stressor layer 22; spalling 235 the GaN substrate 2 that is located beneath the stressor layer 22 to separate a layer of GaN 30 and expose a stressor layer second surface 32 and removing the handle substrate 26; bonding 240 the first surface 24 of the stressor layer 22 to a thermally conductive substrate 34; defining 245 a plurality of second vertical channels 56 having second opposing sidewalls 58 and corresponding to the first vertical channels 38 through the insulating GaN layer 30 to exposed portions 60 of the metal layer 16 in the first channels 38; removing 250 the metal layer 16 in and under the first channels 38 to the stressor layer 22 to electrically isolate the device structures 36; and forming 255 an ohmic contact layer 50 on the stressor layer second surface 32; and forming 260 a plurality of second metal contacts 48 on the ohmic contact layer 50.

Referring to FIG. 12, in one embodiment, method 200 includes forming 205 the GaN substrate 2 having an upper surface 4. Forming 205 may be accomplished in the same manner as forming 105, described above.

Referring to FIG. 13, in one embodiment, method 200 includes forming 210 a plurality of spaced-apart first metal contacts 6 directly on the upper surface 4 of the GaN substrate 2, the contacts spaced apart by exposed portions 10 of the upper surface 4. Forming 210 may be accomplished in the same manner as forming 110, described above.

Referring to FIG. 14, in one embodiment, method 200 includes forming 215 a plurality of first vertical channels 38 having first opposing sidewalls 40 in the exposed portions 10 of the upper surface 4 partially through the GaN substrate 2 to define a plurality of device structures 36, each device structure configured to comprise at least one contact 6. Forming 215 may be accomplished in the same manner as forming 140, as described above. However, in the case of forming 215, in one embodiment the vertical channels 38 extend only partially through the insulating GaN layer 30 to a predetermined depth, and do not extend entirely through the insulating GaN layer so that the channels 38 are not involved in the predetermined fracture or spalling path 70 during spalling.

Referring to FIG. 15, in one embodiment, method 200 includes forming 220 a metal layer 16 on the contacts 6, the exposed portions 10 of the upper surface 4 and the first opposing sidewalls 40, the forming of the metal layer forming a layer of insulating GaN 14 on the exposed portions 10 of the upper surface and a layer of GaN 52 on the first opposing sidewalls 40 and bottom of the channel 41.

Forming 220 may be accomplished in the same manner as forming 115, 160, as described above.

Referring to FIG. 16, in one embodiment, method 200 includes forming 225 a stressor layer 22 on the metal layer 16, the stressor layer 22 having a first surface 24; forming 230 a handle substrate 26 on the first surface 24 of the stressor layer 22. Forming 225 may be accomplished in the same manner as forming 120, as described above.

Referring to FIG. 17, in one embodiment, method 200 includes forming 230 a handle substrate 26 on the first surface 24 of the stressor layer 22. Forming 230 may be accomplished in the same manner as forming 125, as described above.

Referring to FIG. 18, in one embodiment, method 200 includes spalling 235 the GaN substrate 2 that is located beneath the stressor layer 22 to separate a layer of GaN 30 and expose a stressor layer second surface 32 and removing the handle substrate 26. Spalling 235 may be accomplished in the same manner as spalling 130, as described above.

Referring to FIG. 19, in one embodiment, method 200 includes bonding 240 the first surface 24 of the stressor layer 22 to a thermally conductive substrate 34. Bonding 240 may be accomplished in the same manner as bonding 135, as described above.

Referring to FIG. 20, in one embodiment; method 200 includes defining 245 a plurality of second vertical channels 56 having second opposing sidewalls 58 and corresponding to the first vertical channels 38 through the insulating GaN layer 30 to exposed portions 60 of the metal layer 16 in the first vertical channels 38. Defining 245 may be accomplished in the same manner as forming 140, as described above. However, in the case of defining 245 the openings in the photoresist must be opened over the portions of the surface directly above and corresponding to the first vertical channels as would be readily understood by one of ordinary skill in the art.

Referring to FIG. 21, in one embodiment, method 200 includes removing 250 the metal layer 16 in and under the first channels 38 to the stressor layer 22 to electrically isolate the device structures 36; and forming 255 an ohmic contact layer 50 on the stressor layer second surface 32; and forming 260 a plurality of second metal contacts 48 on the ohmic contact layer 50. Removing 250 may be performed by any suitable removal method. In one embodiment, removing 250 includes etching. Etching may include any suitable form of etching, including various wet chemical and dry etching methods, including sputtering etching, reactive ion etching, ion beam etching, plasma etching or laser ablation, for example.

Referring to FIG. 22, in one embodiment, method 200 includes forming 255 an ohmic contact layer 50 on the stressor layer second surface 32. Forming 255 may be accomplished in the same manner as forming 150, as described above.

Referring to FIG. 23, in one embodiment, method 200 includes forming 260 a plurality of second metal contacts 48 on the ohmic contact layer 50. Forming 260 may be accomplished in the same manner as forming 155, as described above.

In one embodiment, method 200 may optionally further comprise etching to remove the insulating GaN layer 30 proximate the channels 38 and define a final channel width. Etching to remove the insulating GaN layer 30 may be performed using the etching processes described above regarding forming 140 the plurality of vertical channels 38.

In one embodiment, method 200 may also optionally include doping the insulating GaN layer 30 to form a p-type region or an n-type region therein, or a combination thereof. Doping may be performed after spalling 130 the GaN substrate 2 to separate the GaN layer 30 as spalled portion 28 and expose the a stressor layer second surface 32. N-type doping can be achieved by adding elements such as, for example, silicon or germanium. P-type doping may be achieved, for example, by adding Mg. Doping may be performed by any suitable method of doping, including ion implantation.

In one embodiment, method 200 may optionally include forming a layer of insulating GaN 52 on the opposing sidewalls 40 of the channels 38, as illustrated in FIG. 20. Forming the layer of insulating GaN 52 on the opposing sidewalls 40 may be performed using the methods described herein for forming the layer of insulating GaN 14. The thickness of the layer of insulating GaN 52 may be any suitable thickness, including those described herein for the layer of insulating GaN 14.

In one embodiment, method 200 may optionally include etching the stressor layer second surface 32 of the GaN layer 30 prior to forming the ohmic contact layer 50 as illustrated in FIG. 7. Etching 280 may be employed to remove damage in the microstructure of the GaN layer 30 proximate the stressor layer second surface 32 resulting from spalling 130, for example. Etching may be performed using the etching processes described above regarding forming 215. The plurality of vertical channels 38, and may be performed concurrently with forming 215 or etching, for example, or may be performed as a separate step.

Figure 25:
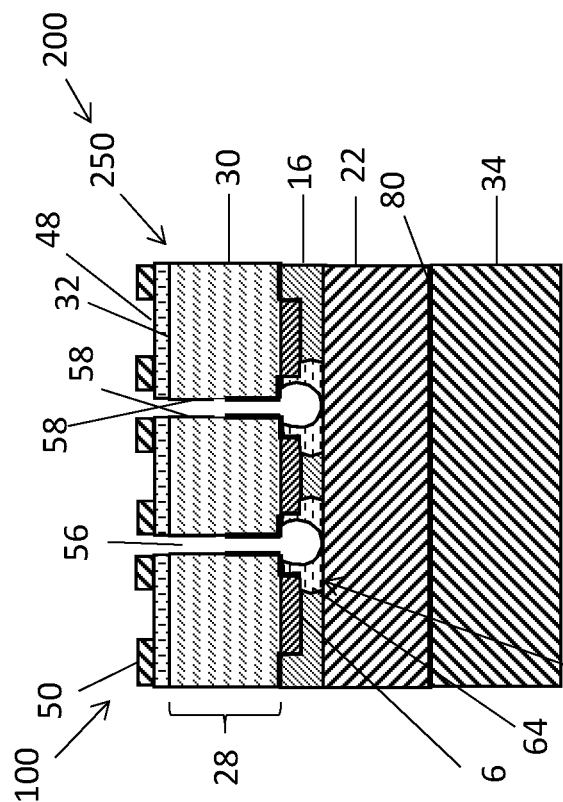
FIG. 25 is a cross-sectional illustration of another alternate embodiment.

Referring to FIG. 25, in an alternate embodiment of method 200, following defining 245, removing 250 is omitted and replaced with oxidizing 290 the metal layer 16 in and under the first channels 38 entirely through the metal layer 16 to the stressor layer 22 to electrically isolate the device structures 36 by forming an oxide plug 68 in the channel. All other operations of method 200 remain the same. Thus, rather than removing the metal layer 16 in the vertical channels 38, the metal layer 16 is converted to an insulating metal oxide in the form of oxide plug 68. Oxidizing 290 may be performed by any suitable method of oxidizing the metal layer, including heating the device structure in oxygen or another suitable oxidizing gas using conventional methods of semiconductor processing to convert a metal or metallic layer (e.g. Si) to a metal oxide.

Figure 24:
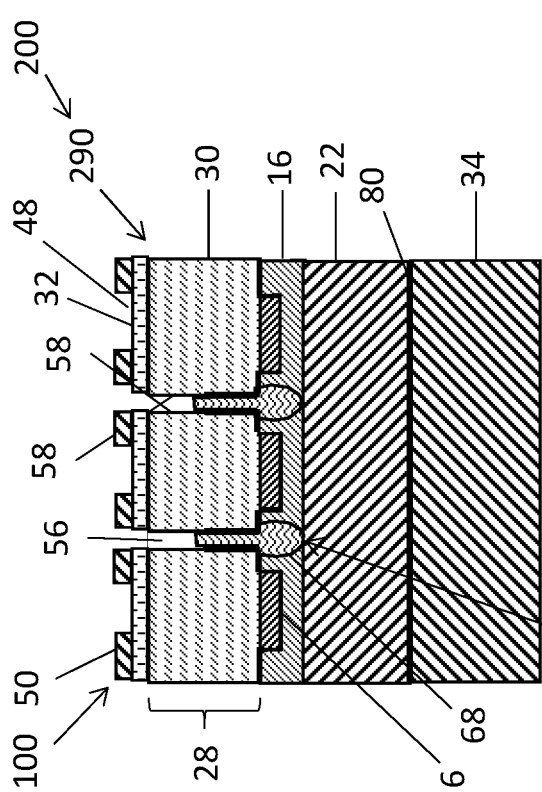
FIG. 24 is a cross-sectional illustration of an embodiment that optionally includes oxidizing the portions of the metal layer under the first channels between the GaN layer/first metal contacts and the stressor layer to increase the electrical isolation between the device structures according to a first embodiment of a method of making a GaN device.

Referring to FIG. 24, in one embodiment, method 200 may also optionally include oxidizing 280 the portions 64 of the metal layer 16 under the first channels 38 between the GaN layer 30/first metal contacts 6 and the stressor layer 22 to increase the electrical isolation between the device structures 36. Oxidizing 280 the portions 64 of the metal layer 1 may be accomplished using thermal (gaseous) or anodic (solution) oxidation. In one embodiment, the oxidized portions 64 of the metal layer 16 comprise an oxide ring.

Methods 100 and 200 advantageously enable the development of novel GaN devices 10 as illustrated in FIGS. 11, 23-25. The GaN devices 10 may be used as diodes, including LED's, and transistor structures, including MESFET structures.

The various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" in any claim or as applied to any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, compositions, or conditions, and the like specified herein, wherein "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
    a substrate;
    an insulating layer arranged on the substrate;
    a conductive metal layer arranged on the insulating layer;
    a contact arranged on the conductive metal layer, wherein the conductive metal layer is on sides of the contact;
    a semiconductor layer arranged on the contact; and
    an oxide region arranged adjacent to the contact in the conductive metal layer.

2. The device of claim 1, further comprising a cavity partially defined by the oxide region.

3. The device of claim 1, wherein the conductive metal layer includes titanium.

4. The device of claim 1, wherein the oxide region includes $TiO_x$.

5. The device of claim 1, wherein the semiconductor layer includes GaN.

6. The device of claim 1, wherein the contact is selected from the group consisting of Ag, Au, Pd, Pt, Ni, W, and Cr.

7. The device of claim 1, wherein the contact is selected from the group consisting of Nb, Al, Ta, Cu, Mg, and Mo.

8. The device of claim 1, wherein the conductive metal layer is an adhesion promoting metal.

9. The device of claim 1, wherein the conductive metal layer is selected from the group consisting of Ti, Cr, Ta, W, Cu, Pt, Al, Au, and Ni.

10. The device of claim 1, wherein the insulating layer includes GaN.

11. The device of claim 1, wherein the contact is arranged on the conductive metal layer such that the contact is embedded in the conductive layer.

* * * * *